United States Patent
Stoner et al.

(10) Patent No.: US 6,417,502 B1
(45) Date of Patent: Jul. 9, 2002

(54) MILLIMETER WAVE SCANNING IMAGING SYSTEM HAVING CENTRAL REFLECTORS

(75) Inventors: Paul D. Stoner, North Canton, OH (US); Clarence T. Tegreene, Seattle, WA (US)

(73) Assignee: Microvision, Inc., Bothell, WA (US)

( * ) Notice: Subject to any disclaimer, the term of this patent is extended or adjusted under 35 U.S.C. 154(b) by 0 days.

(21) Appl. No.: 09/851,672

(22) Filed: May 8, 2001

Related U.S. Application Data

(63) Continuation of application No. 09/128,927, filed on Aug. 5, 1998, now abandoned.

(51) Int. Cl.[7] .............................................. H01L 27/00
(52) U.S. Cl. ..................... 250/208.1; 250/334; 342/179
(58) Field of Search .............................. 250/208.1, 334, 250/234, 235, 332, 336.1, 339.01, 339.02, 339.11; 342/351, 371, 372, 179; 343/754, 755, 753

(56) References Cited

U.S. PATENT DOCUMENTS

| | | | |
|---|---|---|---|
| 5,081,456 A | * | 1/1992 | Michiguchi et al. .......... 342/22 |
| 5,121,138 A | | 6/1992 | Schermer et al. |
| 5,355,181 A | | 10/1994 | Ashizake et al. |
| 5,420,414 A | | 5/1995 | Wentworth |
| 5,438,336 A | | 8/1995 | Lee et al. ................... 342/174 |
| 5,455,590 A | | 10/1995 | Collins et al. .............. 342/179 |
| 5,467,104 A | | 11/1995 | Furness, III et al. |
| 5,543,968 A | | 8/1996 | Freeman et al. |
| 5,557,444 A | | 9/1996 | Melville et al. ............ 359/199 |
| 5,629,790 A | | 5/1997 | Neukermans et al. |
| 5,648,618 A | | 7/1997 | Neukermans et al. |
| 5,673,139 A | | 9/1997 | Johnson |
| 5,687,034 A | | 11/1997 | Palmer ....................... 359/827 |
| 5,694,237 A | | 12/1997 | Melville ..................... 359/214 |
| 5,751,465 A | | 5/1998 | Melville et al. ............ 359/213 |
| 5,999,122 A | | 12/1999 | Shoucri et al. ............. 342/351 |
| 6,034,642 A | | 3/2000 | Kojima et al. .............. 343/753 |

FOREIGN PATENT DOCUMENTS

EP        0 005 918        12/1979

OTHER PUBLICATIONS

Flying Magazine, Weather–Piercing Camera, p. 32, Sep. 1997, USA.
Cal Tech, Receivers, website, Apr. 20, 1998, USA.
Cal Tech, Receivers, website, Apr. 21, 1998, USA.
Wilson, W.J., et al. "Millimeter–Wave Imaging Sensor", IEEE Transactions on Microwave Theory and Techniques, Oct. 1986, vol. MIT–34, No. 10, pp. 1026–1035.
Vowinkel, B., et al., "Cryogenic all solid–state millimeter wave–receivers for airborne radiometry" Database Inspection Online! Institute of Electrical Engineers, Stevenage, GB, Database Accession No. 2242674 and 1983 IEEE MTT–S International Microwave Symposium, Boston, MA Jun. 1983, vol. MTT–31, No. 12, pp. 996–1001.

\* cited by examiner

Primary Examiner—Que T. Le

(57) ABSTRACT

An imaging system includes a scanning reflector that sweeps through a periodic scan pattern to redirect millimeter wave energy from a target object to a detector. The imaging system may include one or more millimeter wave lenses that gather and focus the millimeter wave energy from the target object onto the reflector or the detector. The detector is super-cooled to increases sensitivity, so that the imaging system does not require an illumination source. For each location on the target object, the detector monitors the intensity of the millimeter wave energy and an electronic controller builds a memory map from the detector data. Because different materials block millimeter wave energy differently, the detector data, and thus the memory map corresponds to the structure of the target object. In one embodiment, the scanning reflector is a resonant scanner. The scanner may be a microelectromechanical (MEMs) or mesomechanical scanner.

17 Claims, 9 Drawing Sheets

MILLIMETER WAVE SCANNING IMAGING SYSTEM HAVING CENTRAL REFLECTORS

This application is a continuation of application Ser. No. 09/128,927, filed Aug. 5, 1998, abandoned.

TECHNICAL FIELD

The present invention relates to millimeter wave devices, and more particularly, imaging devices that utilize scanned millimeter waves.

BACKGROUND

Millimeter wave devices promise many useful applications, because such devices provide a small solution to many local transmission applications. Moreover, millimeter wave devices may be useful in detecting objects behind optically opaque barriers, much like X-rays. Advantageously, millimeter wave devices can take advantage of many optical techniques, such as focusing lenses and reflectors. This capability provides flexibility in developing small components with unique capabilities.

One application of millimeter wave devices is for imaging through opaque materials, such as concrete walls and plastic boxes. Conventional millimeter wave imaging devices utilize highly sensitive detectors fed by fixed waveguides. To image a target object, the entire device is moved until the waveguide is aligned to the target object. The waveguide then collects millimeter wave energy emitted or reflected by the target object and directs the millimeter wave energy to the detector.

Typically, the field view of the waveguide is quite small. Consequently, the portion of the target object that can be image at any one time is quite small. Imaging the entire target object can therefore involve moving the entire device through a series of many orientations. At each location, the millimeter wave energy is sampled and stored. Gradually, an entire data set is built up. From the data set, signal processing can produce an image of the target object.

One difficulty with this approach is the time required to generate the entire data set. Gathering data in this fashion can be tedious and costly.

This difficulty becomes particularly problematic where the target object is moving. In such a circumstance, the time lag between data taken for a first orientation and data for a second orientation may be sufficiently large that the target object may move significantly during the time lag. The final data set may represent portions of the image taken for different positions of the target object. Consequently, the data set may represent a highly distorted image of the target object.

SUMMARY OF THE INVENTION

A millimeter wave scanning imager scans an image field to collect millimeter waves from an external environment. A sensitive detector monitors the millimeter wave energy received from the external environment and produces an electrical signal indicative of the energy received. An electronic controller samples the electrical signal to produce image data corresponding to the scanned millimeter wave energy.

Because the electronic controller concurrently monitors the scan position, the electronic controller can determine the corresponding location in the external environment for producing the image data. Accordingly, the electronic controller can build an image data set representative of the external environment.

In one embodiment, the imager includes a scanner that scans one or more reflectors through a periodic two-dimensional scan pattern. The scan pattern may be a raster pattern or another type of pattern, such as a vector or spiral pattern.

One embodiment of the scanner is a microelectromechanical (MEMs) scanner. The MEMs scanner is a biaxial scanner having a central reflector coated with a conductor.

In another embodiment, the scanner includes two mechanically resonant scanners driven by electromagnetic coils. The central reflectors of the scanners formed from a metal that reflects the millimeter wave energy.

To improve the sensitivity, the imager also includes dielectric lenses that gather and focus the millimeter wave energy onto the detector. One embodiment also includes additional dielectric lenses with variable positioning to adjust the imaging distance of the imager.

To improve the detector sensitivity, the imager also includes a super cooler that cools detector to a very low temperature. The very low temperature reduces the detector noise to improve the signal to noise ratio of the imager. Consequently, the imager does not require an illuminating millimeter wave source.

Because the millimeter wave imager is formed from small components, including a small super cooler, and does not require a separate source, the imager may be small and light enough to be human portable.

DETAILED DESCRIPTION

Figure 1:
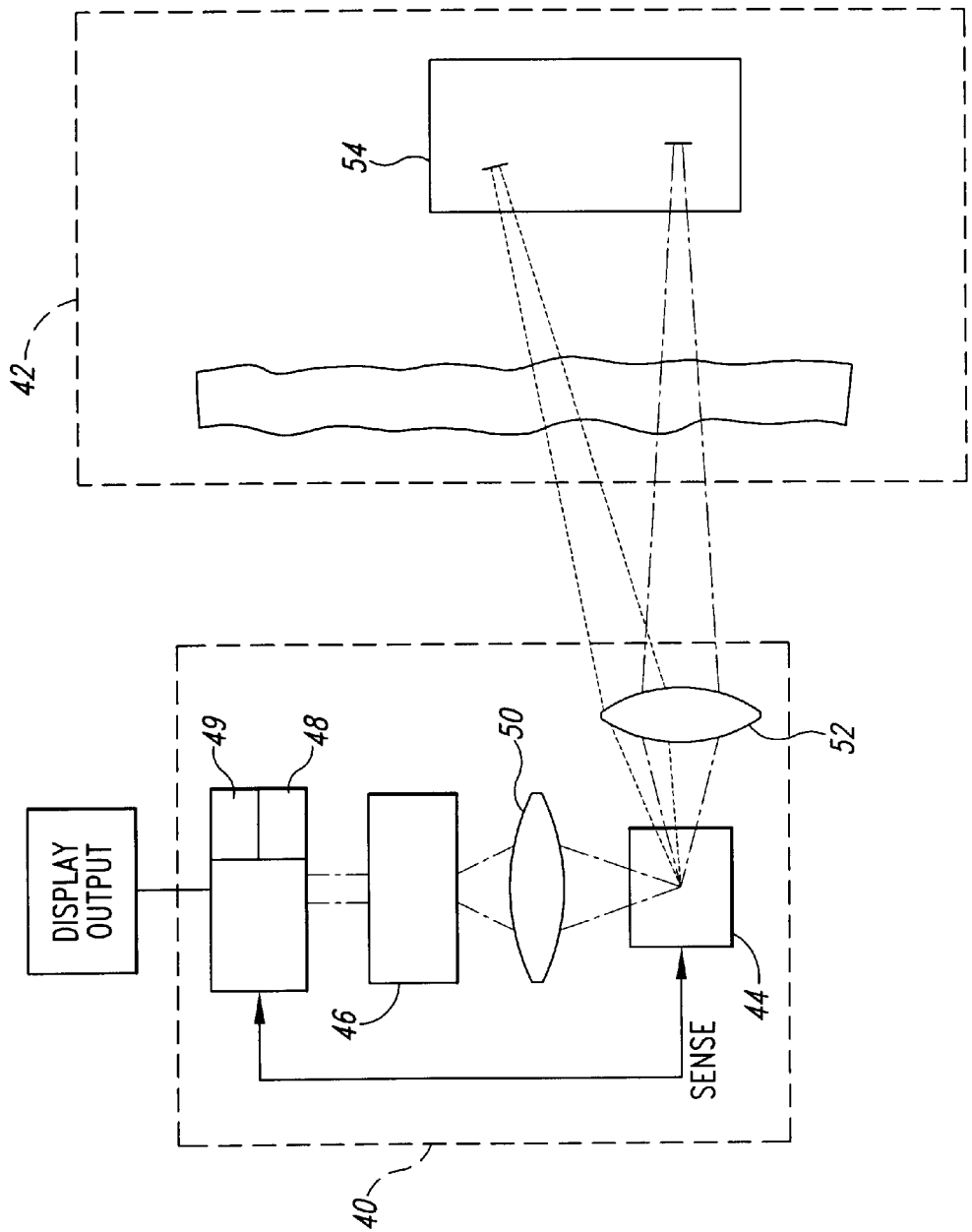
FIG. 1 is a block diagram of a scanning imager according to one embodiment of the invention.

As shown in the simplified block diagram of FIG. 1, a scanning imager is aligned to an external environment 42.

The imager 40 includes a scanning assembly 44 that acts as the principal scanning component. As will be described in greater detail below with reference to FIG. 2, the scanning assembly 44 redirects millimeter wave energy from a series of locations in the external environment 42 toward a millimeter wave detector 46.

The millimeter wave detector 46, which will be described in greater detail below with reference to FIG. 7, responds to the millimeter wave energy by producing an electrical signal. An electronic controller 48 receives the electrical signal and produces data indicative of the millimeter wave energy level.

At the same time, the scanning assembly 44 provides a sense signal to the electronic controller 48 that indicates the orientation of the scanning assembly 44. Responsive to the sense signal, the electronic controller 48 stores the produced data in a memory device 49 in locations corresponding to the orientation of the scanning assembly 44. The controller 48 thus builds a memory map indicative of the millimeter wave energy versus scan angle.

A first dielectric lens 50, positioned between the scanning assembly 44 and the electronic controller 48 improves the sensitivity of the imager 40 by gathering and focusing the millimeter wave energy from the scanning assembly 44 onto the detector 46. A second dielectric lens 52 is positioned between the scanning assembly 44 and the external environment 42. The second lens 52 gathers and focuses millimeter wave energy from the external environment 42 onto the scanning assembly 44. Additionally, the relative positions of the first and second lenses 50, 52 can be varied to adjust the effective distance between the detector 46 and a target object 54 in the external environment 42.

As will now be described with reference to the simplified block diagram of FIG. 2, the scanning assembly 44 includes a central reflector 56 that pivots about two orthogonal axes 58, 60. The central reflector 56 is conductively coated such that it reflects millimeter waves toward the detector 46. Because the central reflector 56 is substantially planar, the energy reflected toward the detector 48 comes from a small region 62 of an image field 64.

Figure 2:
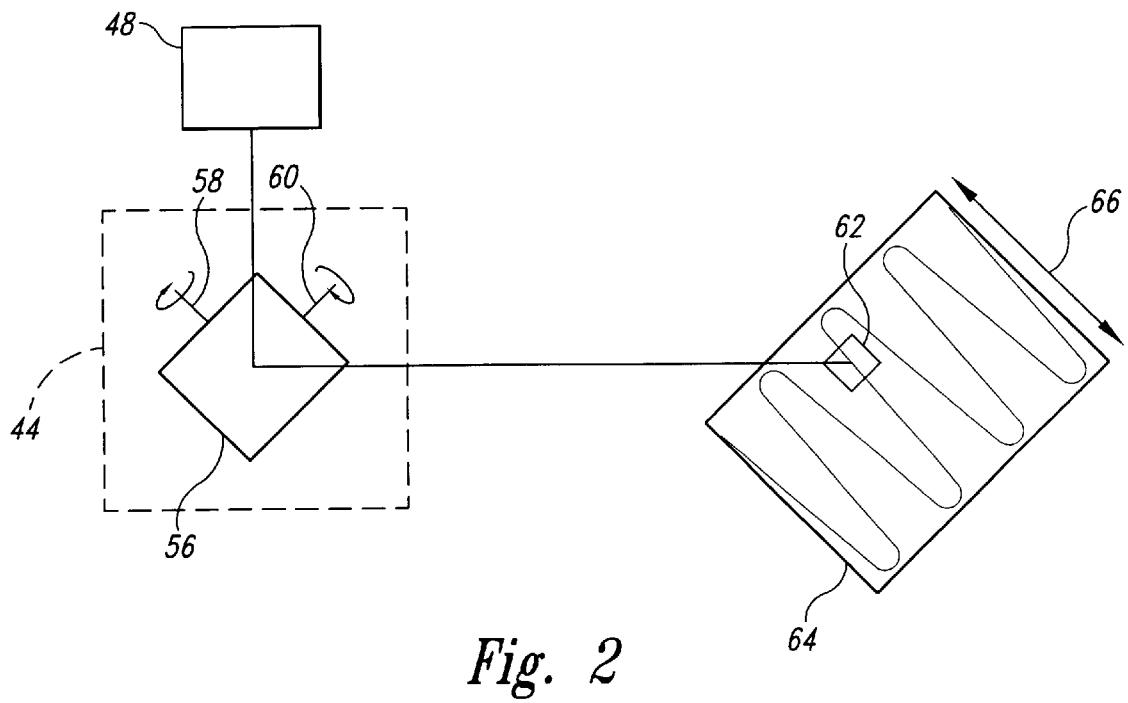
FIG. 2 is a block diagram of a scanning assembly within the imager of FIG. 1, including a central reflector 56 that pivots about two orthogonal axes.

As the central reflector 56 pivots about the first axis 58, the small region 62 moves in a first direction 66 in the image field 64. The field of view of the detector 46 thus sweeps through a line in the image field 64.

Where the scanning assembly 44 is a mechanically resonant system, the central reflector 52 pivots periodically in a sinusoidal pattern, as shown in FIG. 2. One skilled in the art will recognize that for non-resonant systems, other scanning patterns may be used.

At the same time that the central reflector 56 sweeps in the first direction, the central reflector 56 also pivots about the second axis 60 at a rate that is substantially lower than the scan rate about the first axis 58. The field of view thus sweeps along a path that has components along the first and second axes, as represented in FIG. 2. Because the scan rate in the first direction is substantially higher than the rate in the second direction, the small region 62 scans the image field 64 in a sinusoidal pattern that approximates a raster pattern. One skilled in the art will recognize that other scan patterns may be used, although the substantially raster pattern is often preferred because of its compatibility with typical signal processing techniques.

Because the small region 62 traverses substantially the entire image field 64 during the raster sweep, the detector 46 receives energy sequentially from the entire image field 64. For each location of the small region 62, the detector 46 outputs an electrical signal corresponding to the millimeter wave energy coming from the location. The electronic controller 48 receives the electrical signal and identifies image data that represents the received energy from the image field 64. As described above, the electronic controller 48 can correlate the image data to the location in the image field, because the scanning assembly 44 supplies the sense signal indicative of the scan angle. The imager 40 can thus generate an entire map of the target object 54 from the image data.

Figure 3:
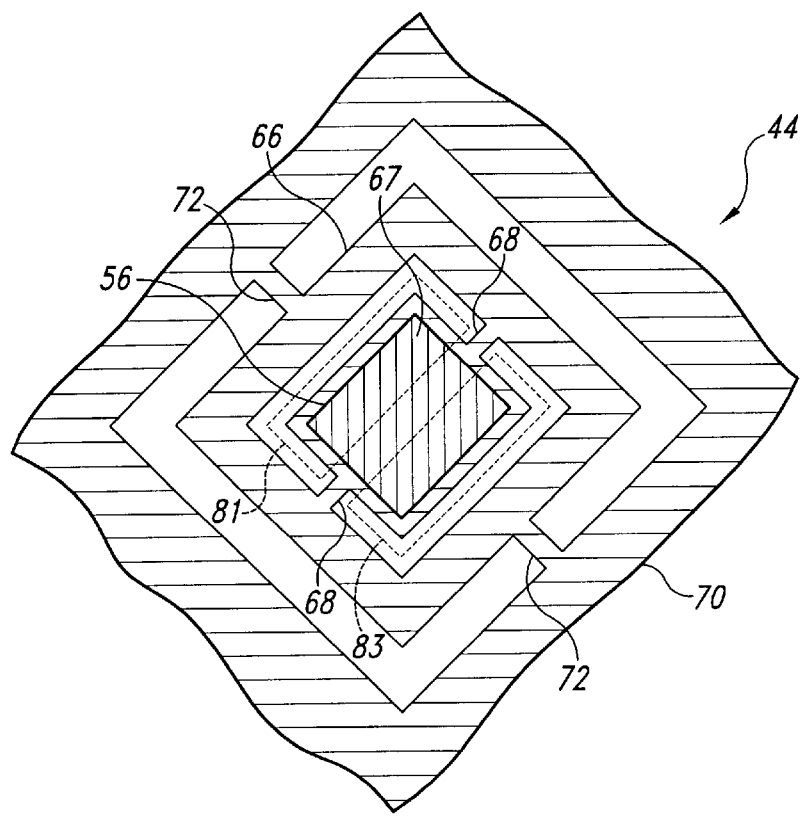
FIG. 3 is a top plan view of a biaxial MEMs reflector for reflecting millimeter wave energy.

FIG. 3 shows one embodiment of the scanning assembly 44 where the central reflector 56 is mounted to a pivoting ring 66 by a pair of torsion arms 68. The pivoting ring 66 is mounted in turn to a substrate 70 by a pair of secondary torsion arms 72. Each of the torsion arms 68, 70 twists torsionally to allow the central reflector 56 and pivoting ring 66 to pivot about respective orthogonal axes.

In a preferred embodiment, the scanning assembly 44 of FIG. 3 is a microelectromechanical (MEMs) device formed from a silicon substrate. To make the central reflector 56 reflective to millimeter waves, the central reflector 56 includes a conductive coating 67, such as an aluminum or gold film. Redirection of millimeter waves from fixed reflectors is known in the art.

Unlike typical fixed reflectors, the central reflector 56 in this embodiment is able to pivot quickly through a periodic pattern. To pivot the central reflector 56 about a first axis, magnetic fields from a separate source (not shown) interact with currents flowing through conductive traces on the pivoting ring 66, thereby sweeping the pivoting ring 66 about the first axis. Since the pivoting ring 66 carries the central reflector 56, the motion of the pivoting ring 66 produces corresponding motion of the central reflector 56.

The central reflector 56 can pivot about a second axis relative to the pivoting ring 66. A pair of conductive plates 81, 83 are positioned on opposite sides of the second axis and aligned to the central reflector 56. In operation, a driving voltage is applied alternatingly to the first conductive plate 81 and then the second plate 83. The voltage difference between the driven plate 81 or 83 and the corresponding part of the central reflector 56 produces a torque that causes the central reflector 56 to pivot about the second axis.

The central reflector 56 and torsion arms 68 are dimensioned so that the central reflector 56 oscillates at a desired resonant frequency. The system has a relatively high Q, so that only a small portion of the energy in the central reflector 56 and torsion arms 68 is lost during a sweep. Consequently, the amount of energy that must be added to cause pivoting is reduced relative to a low Q system. For high efficiency, the voltage on the plates is varied at the resonant frequency of the central reflector 56.

The structure and fabrication of such biaxial MEMs devices is described in detail in U.S. Pat. No. 5,629,790 to Neukermans et. al., entitled MICROMACHINED TORSIONAL SCANNER, which is incorporated herein by reference. One skilled in the art will recognize that the central reflector 56 and torsion arms 68, 70 will be sized and shaped appropriately for millimeter waves. For example, the central reflector 56 will typically be substantially larger for millimeter waves than a MEMs mirror in an optical device.

Figure 4:
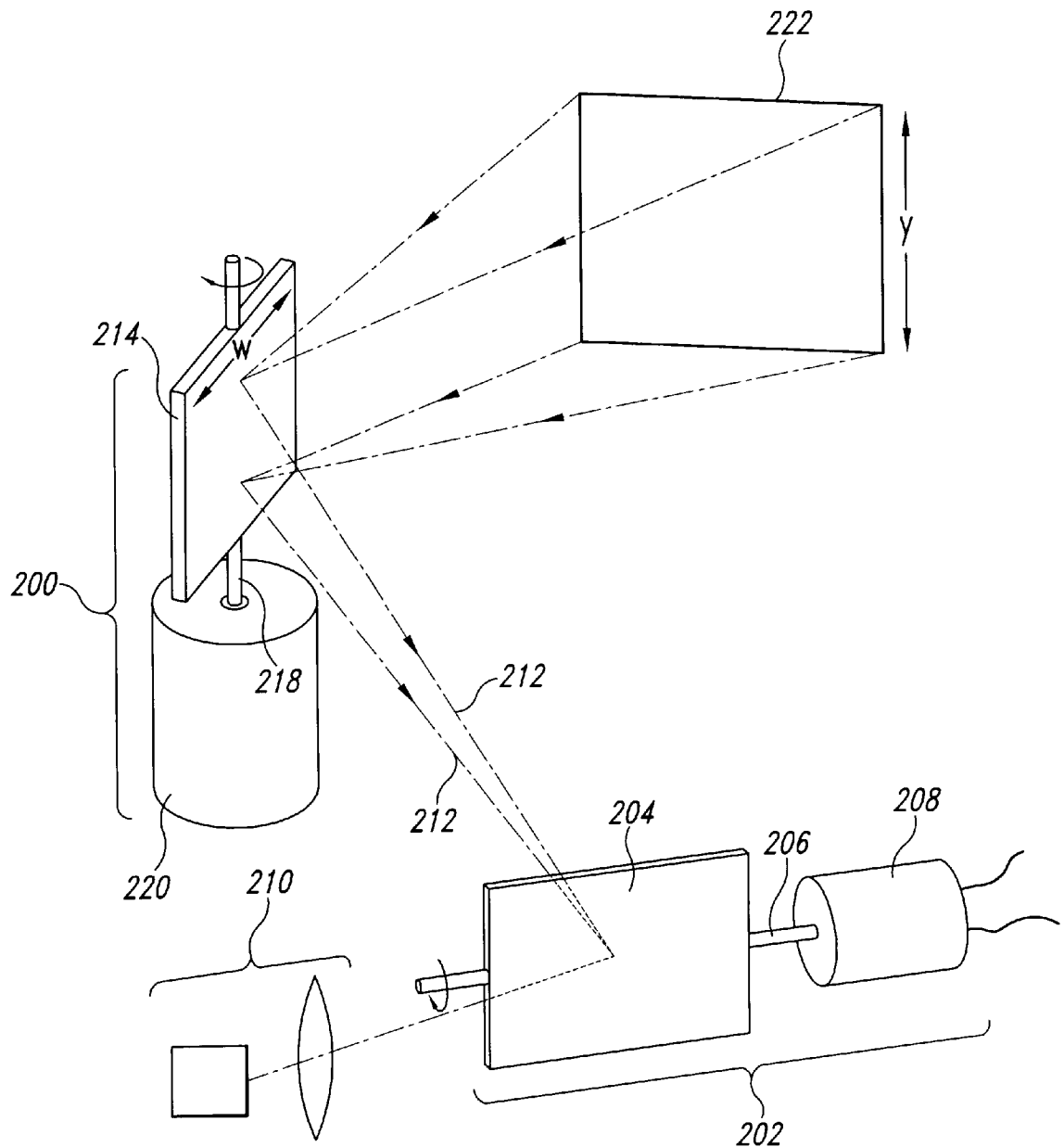
FIG. 4 is a diagram of a two mirror scanning assembly, including a horizontal reflector and a vertical reflector.

As shown in FIG. 4, the scanning assembly 44 may be formed from separate horizontal and vertical scanners 200, 202. As shown in FIG. 4, the separate scanners are mesomechanical devices, although MEMs devices could also be used. Because the horizontal scanner 200 is a resonant device with a high Q (>100), the scanner 200 can operate with a relatively low drive power. Typically, the resonant frequency of the scanner 200 is greater than 1000 Hz, and may be greater than 10 kHz. As one skilled in the art will recognize from the calculations below, higher frequencies can produce higher resolutions for a given scan angle.

The vertical scanner 202 is formed from a vertical reflector 204 mounted to a shaft 206 driven by a motor 208. The motor 208 is a commercially available device that rotates the vertical reflector 204 linearly from one extreme to another about a first axis. Typically, the vertical reflector 204 will pivot by about 10–20 degrees to produce a 20–40 degree field of view. Depending upon the application, the vertical scanner 202 will typically follow a saw-tooth or triangular scan pattern. However, other scan patterns, such as stair-step or sinusoidal patterns may be used in some applications.

The horizontal scanner 200 includes a horizontal reflector 214 mounted to a shaft 218 of a motor 220. The horizontal reflector 214 is positioned in the field of view of the detector 210 as deflected by the vertical reflector 204. The motor 220 spins the horizontal reflector 214 about a second axis orthogonal to the first to provide a horizontal component to the scanning pattern. The field of view of the detector 210 thus covers a two-dimensional image field 222.

The horizontal scanner 200 scans at a substantially higher rate than the vertical scanner 202. For example, in one embodiment, the horizontal reflector 214 has a width D of 2 inches (50.8 mm) and the millimeter wave energy is at 1.2 THz. For an expected 60 degree (1.047 rad) field of view, the number of pixels can be approximately:

$$P = D\theta/\lambda = 50.8 \text{ mm} * 1.047 \text{ rad}/0.25 \text{ mm} = 212.75 \text{ pixels}.$$

In a vacuum environment, the motor 220 can drive the reflector 214 at speeds on the order of 1,000–100,000 rpm. For a 200 by 200 pixel image where the reflector spins at 60,000 rpm (1000 Hz), the frame rate with a 10% allowance for frame transition would be:

$$F = 1000 \text{ Hz}/(200 \text{ lines} * 1.1) = 4.54 \text{ frames per second}.$$

If both sides of the reflector 214 are reflective, the effective scan rate will be doubled, providing a frame rate of 9.08 frames per second. This rate is below typical display rates of many systems, but is sufficient for many applications.

One skilled in the art will recognize that a variety of other designs may desirable for some applications. For example, where the millimeter wave energy is at 600 GHz, the resolvable pixels will be 106.37. In such an imager, a 100 by 100 pixel image would give a frame rate of about 18 frames per second.

Figure 5:
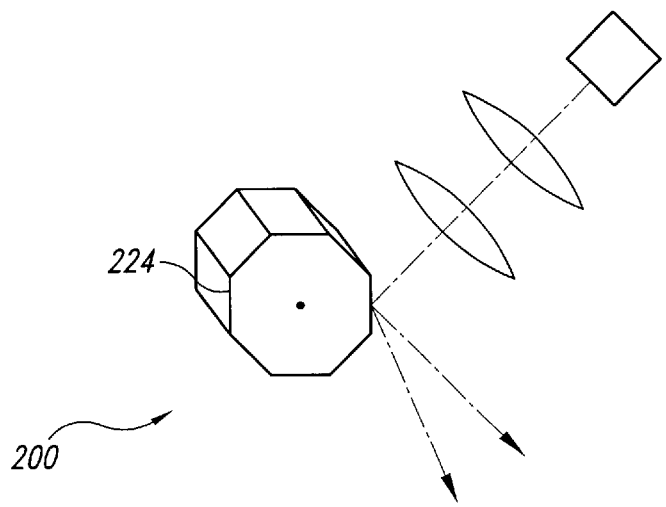
FIG. 5 is diagram of a millimeter wave scanner using a polygon-type reflector.

As shown in FIG. 5 the horizontal scanner 200 can use a polygonal reflector 224 to increase the frame rate. The polygonal reflector 224 is an eight sided reflector with each face canted at a respective angle. Consequently, each face provides a respective vertical component to the vector angle of the scan. Because the reflector 224 has eight sides, the imager will produce 8 lines per rotation of the polygon. Following calculations described above, a polygon having 1 inch sides would produce about 34 pixels per line for a 20 degree field of view and a 0.25 mm wavelength.

In this embodiment, the effective horizontal scan rate is 3,000 Hz at 60,000 rpm. A 100 by 100 pixel display would then have a frame rate of 27 frames per second.

Figure 6:
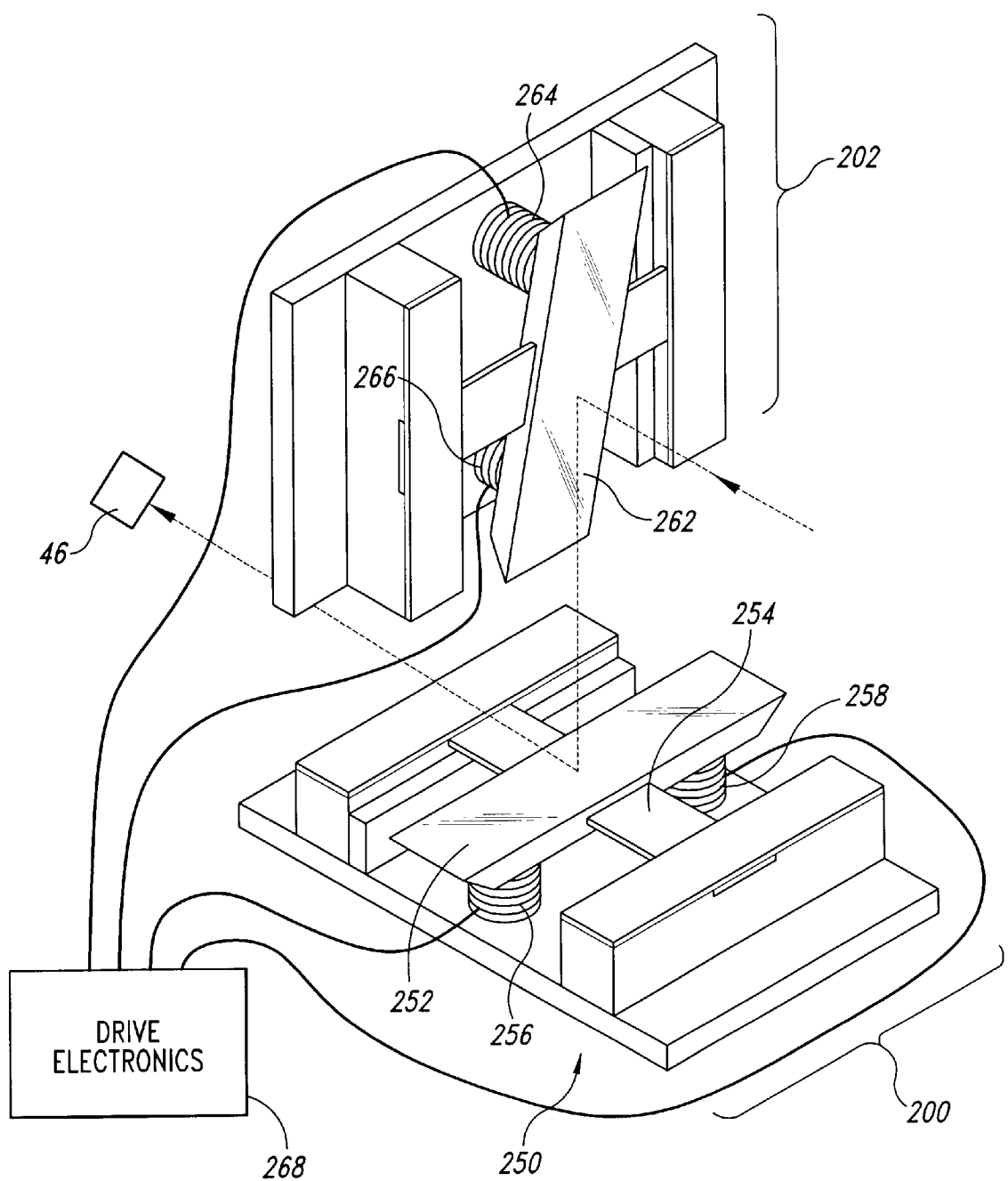
FIG. 6 is diagram of a two mirror scanning assembly, including a mechanically resonant scanner.

For higher frame rates and a more stable system, in some applications a resonant mechanical scanner 250 may form the horizontal scanner, as shown in FIG. 6. The principal scanning component of the resonant scanner 250 is a moving mirror 252 mounted to a spring plate 254. The dimensions of the mirror 252 and spring plate 254 and the material properties of the spring plate 254 are selected so that the mirror 252 and spring plate 254 have a high Q with a natural oscillatory ("resonant") frequency on the order of 1–20 kHz, where the selected resonant frequency depends upon the application.

A ferromagnetic material mounted with the mirror 252 is driven by a pair of electromagnetic coils 256, 258 to provide motive force to mirror 252, thereby initiating and sustaining oscillation. The ferromagnetic material is preferably integral to the spring plate 254 and body of the mirror 252. Drive electronics 268 provide electrical signals to activate the coils 256, 258. Responsive to the electrical signals, the coils 256, 258 produce periodic electromagnetic fields that apply force to the ferromagnetic material, thereby causing oscillation of the mirror 252. If the frequency and phase of the electric signals are properly synchronized with the movement of the mirror 252, the mirror 252 oscillates at its resonant frequency with little power consumption.

In this embodiment, the vertical scanner 202 is structured very similarly to the resonant horizontal scanner 200. Like the horizontal scanner 200, the vertical scanner 202 includes a mirror 262 driven by a pair of coils 264, 266 in response to electrical signals from the drive electronics 268. However, because the rate of oscillation is much lower for vertical scanning, the vertical scanner 202 is typically not resonant. As described above, the vertical scanner 202 directs millimeter wave energy toward the horizontal scanner with vertical deflection at about 30–100 Hz. Advantageously, the lower frequency allows the mirror 262 to be significantly larger than the mirror 214, thereby reducing constraints on the positioning of the vertical scanner 202.

The details of mechanically resonant scanning are described in greater detail in U.S. Pat. No. 5,557,444 of Melville, et al., entitled MINATURE OPTICAL SCANNER FOR A TWO AXIS SCANNING SYSTEM which is incorporated herein by reference.

Figure 7:
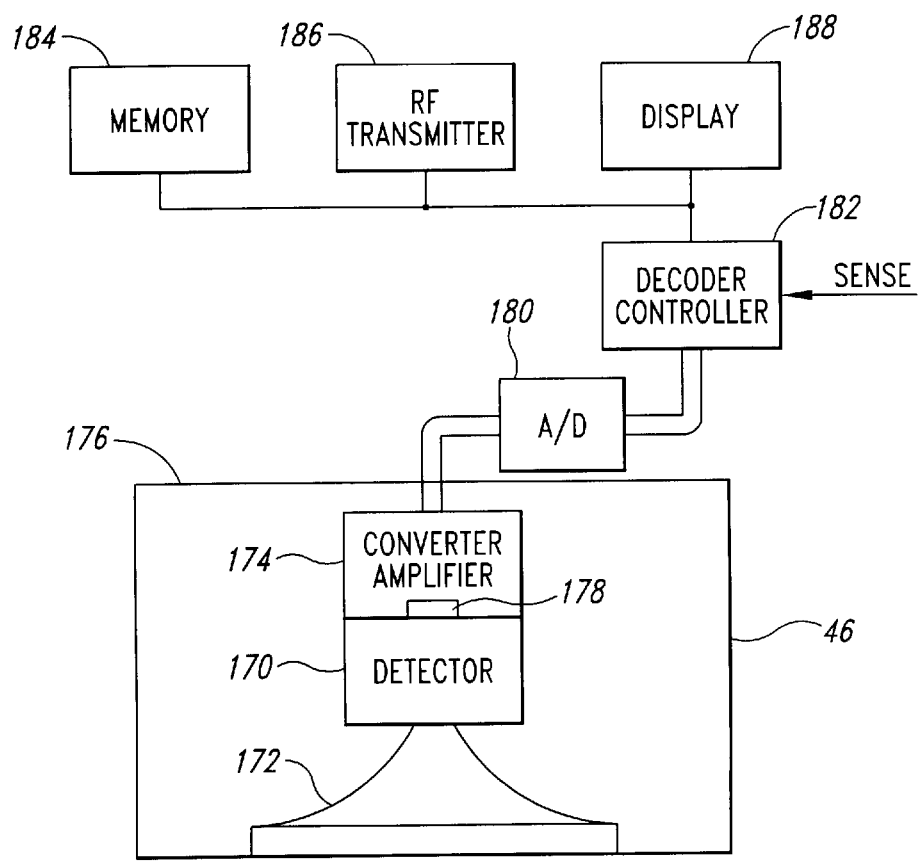
FIG. 7 is block diagram of a millimeter wave detector within the scanning imager of FIG. 1.

As shown in FIG. 7, the detector 46 includes a very sensitive detector diode 170 fed by a collector 172. The detector 46 drives a high gain amplifier and down converter 174 that produces an output signal corresponding to modulation of the millimeter wave energy. To improve the overall signal to noise ratio of the system, the diode 170 and converter 174 are super cooled by a conventional super cooler 176. Such super coolers are commercially available devices.

To improve receiver selectivity, the receiver may employ a single or double superheterodyne conversion detector. This design methodology allows for tuning of the received millimeter wave energy over a band of useable frequencies.

Tuning is accomplished by the use of a voltage controlled local oscillator (VCLO) 175, which mixes with the original impinging millimeter wave energy and produces subsequent first and second stage intermediate frequency if output signals which are then further filtered and amplified into amplifier and down converter 174. This conversion process results in better overall sensitivity, increased signal to noise ratio performance, and the ability to "see through" or penetrate various types of materials.

An A/D converter 180 receives the output from the converter 174 and produces digital data in response. A controller 182 receives the digital data and also receives a sense signal indicating the scan position. In response, the controller 182 generates a data map that is stored in a memory 184. Additionally, the controller 182 can output the data map through a RF transmitter 186 or on a display 188.

Figure 8:
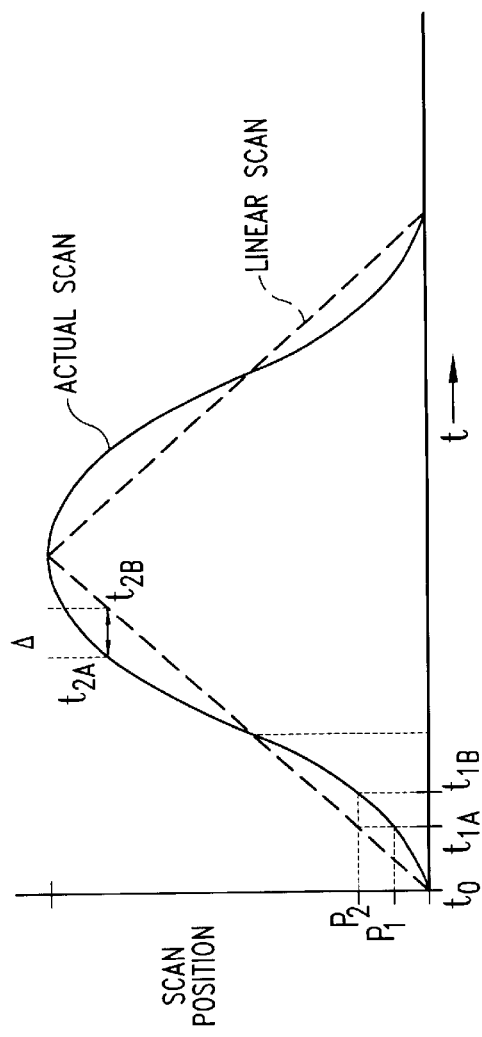
FIG. 8 is a diagrammatic representation of differences between a sinusoidal scan and a linear scan.

For most applications, the controller 182 includes a preprocessor that processes the data from the detector 170 according to conventional video image processing techniques to remove non-linearities and other image artifacts. In many applications, software drivers, dedicated image processors and other signal processing techniques are applied either before or after the data is stored in the memory 184. The level of processing and location of these additional processing components will be dictated by the particular application. For example where sufficient computing resources are available in a notebook computer, much of the processing may be done on the notebook computer. In other applications, it may be desirable to perform additional processing at a remote location.

Where the scanning system of FIG. 4 is a resonant or other nonlinear scanning system, equally spaced physical locations on the target object 54 do not correspond to equally spaced sampling times. As shown by broken line in FIG. 8, the timing of data is often premised upon a linear scan rate. That is, for equally spaced subsequent locations in a line, the data arrive at constant intervals. A resonant scanner, however, has a scan rate that varies sinusoidally, as indicated by the solid line. For a start of line beginning at time $t_0$, the sinusoidal scan initially lags the linear scan. Thus, at time $t_{1A}$ the sinusoidal scan will reflect energy from position $P_1$ to the detector 46. A linear scan assumption would place the corresponding data in the memory 184 at a location corresponding to position $P_2$.

To address this non-linearity, the system of FIG. 7 employs unevenly spaced pulses of an adjusted clock to clock data out of the AJD converter 180, instead of typical equally spaced clock pulses. Generally, for a pixel to be located at position $P_1$, the sampling pulse arrives at time $t_{1B}$, rather that time $t_{1A}$, as would be the case for a linear scan rate.

Figure 9:
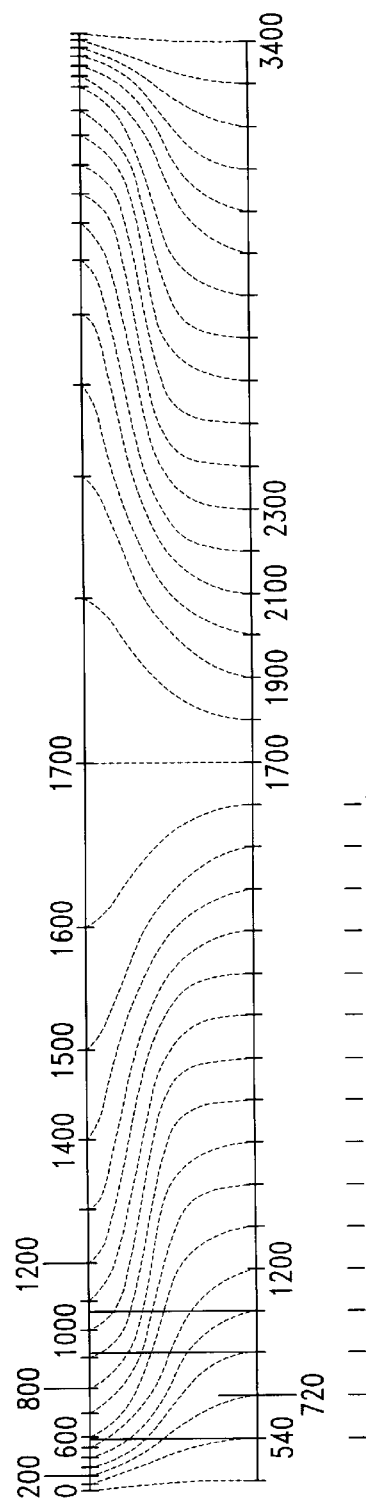
FIG. 9 is a diagrammatic representation of relative timing of scanned data versus uniformly spaced data.

FIG. 9 shows graphically the determination of clock timing for a 35-pixel line. One skilled in the art will recognize that this example is simplified for clarity of presentation. A typical line may include hundreds or even thousands of pixels, As can be seen, the pixels will be spaced undesirably close at the edges of the field of view and undesirably far at the center of the field of view. Consequently, the image will be compressed near the edges of the field of view and expanded near the middle, forming a distorted image.

As shown by the upper line, pixel location varies nonlinearly for pixel counts equally spaced in time. Accordingly, the actual locations of evenly spaced pixels, shown by the lower line, correspond to nonlinearly spaced counts. For example, the first pixel in the upper and lower lines arrives at the zero count and should be located in the zero count location. The second pixel should be stored in a memory location corresponding to the 100 count; but does not arrive until the 540 count. Similarly, the third pixel is to be stored in a memory location corresponding to count 200 and arrives at count 720. One skilled in the art will recognize that the figure is merely representative of the actual calculation and timing. For example, some output counts will be higher than their corresponding input counts and some counts will be lower. Of course, a pixel will not actually be stored before its corresponding data arrives.

To address this condition, the system of FIG. 10 (described below) imposes a latency on the output of data, in a similar fashion to synchronous memory devices. For the example of FIG. 9, a single line latency (3400 count latency) would be ample. With such a latency, the first pixel would be stored at count 3400 and the second would occur at count 3940.

Figure 10:
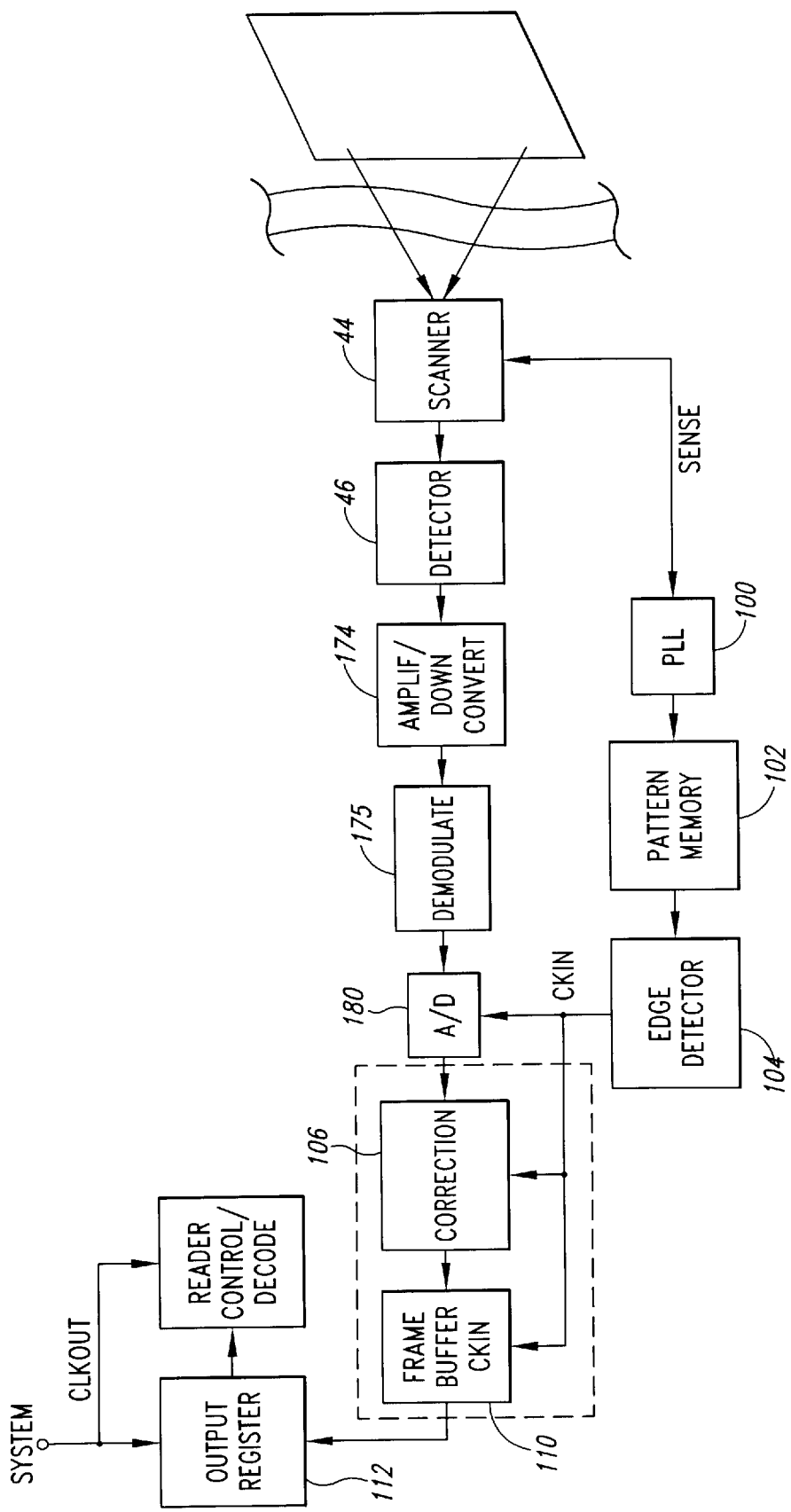
FIG. 10 is system block diagram of a millimeter wave imaging system, including timing synchronized to the scanning reflector.

Turning to FIG. 10, timing is referenced to the scanning assembly 44. As noted above, the scanning assembly 44 includes a high-Q resonant scanner as the principal scanning component. As a high-Q resonant system, the scanning assembly 44 scans at its resonant frequency $f_{SCAN}$. The resonant frequency depends upon the specific geometry, materials, and other characteristics of the scanner. Additionally, the scanning frequency $f_{SCAN}$ may vary in response to changing environmental conditions, including temperature and pressure.

As the scanning assembly 44 scans the target object 54, the scanning assembly also outputs the sense signal to a phase locked loop 100. The phase locked loop locks to the scanning frequency $f_{SCAN}$ and outputs a sampling signal at a sampling frequency that is synchronized to the scanning frequency $f_{SCAN}$. Typically, the sampling frequency is an integral multiple of the scanning frequency $f_{SCAN}$.

Rather than using an actual counter and a look up table to identify the adjusted counts, the system of FIG. 10 uses a simplified structure in which the sampling signal drives a pattern memory 102 to produce an adjusted clock that controls timing of operations in the imager 40. The pattern memory 102 is programmed with data that correspond to the adjusted counts corresponding to the proper memory location.

Responsive to the clock from the phase locked loop 100, the pattern memory 102 outputs data to an edge detector 104. In response to transitions of the data, the edge detector 104 provides pulses that form the sampling clock. Near the edges of the scan, the scanning assembly 44 is moving slowly, due to its sinusoidal motion. Consequently, it is desirable for pulses of the sampling clock to be spaced far apart in time.

Accordingly, the pattern memory 102 outputs data with few transitions during this portion of the scan. For example, corresponding locations in the pattern memory 102 may contain all "0s" or a long string of "0s" followed by a long string of "1s." Near the middle of the scan, the scanning assembly moves at its highest rate. It is desirable therefore, to sample data quickly in this region. Consequently, the corresponding locations in the pattern memory contain interleaved "0s" and "1s".

The output of the edge detector 104 clocks data through the A/D converter 80 to sample the down converted data from the amplifier and down converter 74. The sampled data forms an address in a correction buffer 106 to produce corrected data. The correction buffer contains gamma corrected data that correct for gain distortion and other nonlinear characteristics of the system.

The corrected data is then stored in a frame buffer 110 to be output through a register in response to a system clock. The system clock typically comes from reader control circuitry or another clock that is independent of the sampling clock. The data output from the register can then be processed in a conventional fashion to identify information about the target object or to generate a visual display of the target object.

Figure 11A:
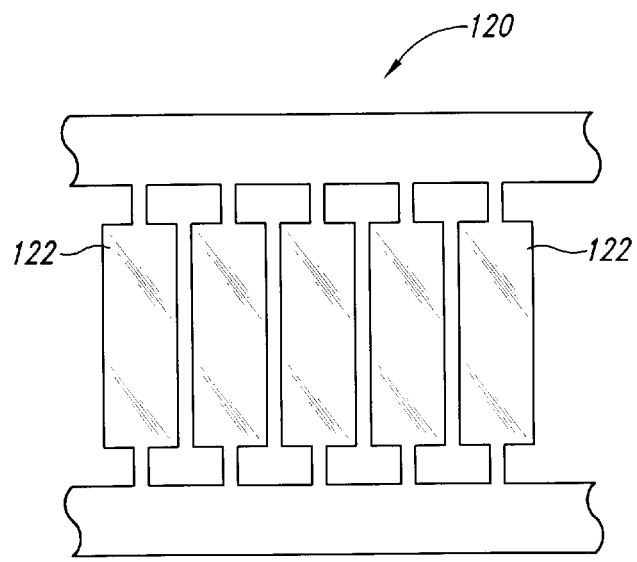
FIG. 11A is a top plan view of a multi-element scanning reflector.
Figure 11B:
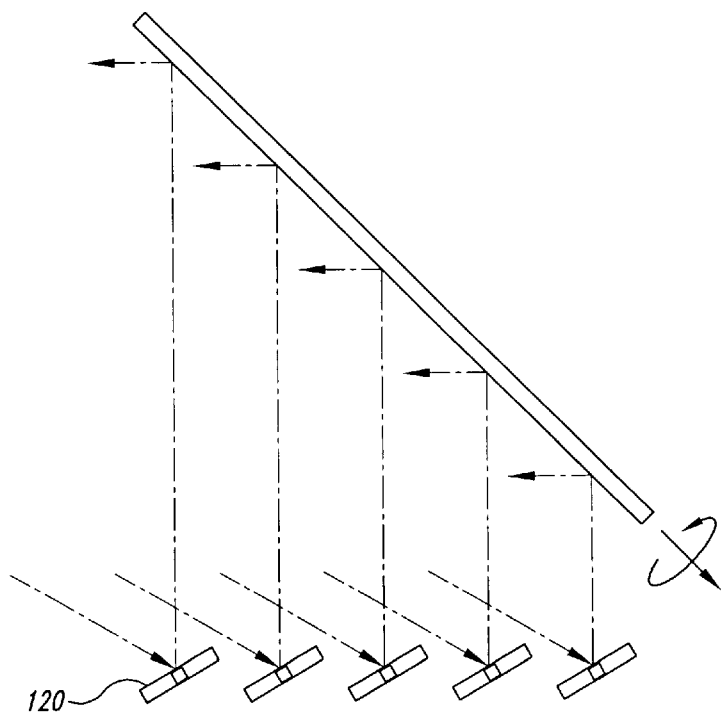
FIG. 11B is a side cross-sectional view of a multi-element scanning reflector of FIG. 11A.

FIGS. 11A and 11B show an alternative embodiment of a millimeter wave scanner 120 that includes an array of reflectors 122 that pivot about parallel axes. Each of the scanners 120 may be a MEMs device, a motor driven scanner such as those of FIG. 5, or a resonant scanner, such as those of FIG. 7. The drive electronics 218 (FIG. 1) drive all of the reflectors 122 synchronously so that all of the reflectors 122 pivot together. The overall scanner 120 appears to operate very similarly to a conventional louvered window shade with individual components pivoting synchronously, although the individual reflectors 122 typically pivot periodically. Because the reflectors 122 pivot synchronously, they form an effective reflector that is substantially larger than any individual reflector 122. However, because the dimension of each individual reflector 122 transverse to the axis of rotation is substantially smaller than that of the overall effective reflector, the individual reflectors 122 can be made resonant at higher rates for given drive currents. One skilled in the art will recognize that, because the system is not limited coherent radiation, diffractive effects of the multiple reflector elements will be minimized.

Figure 12:
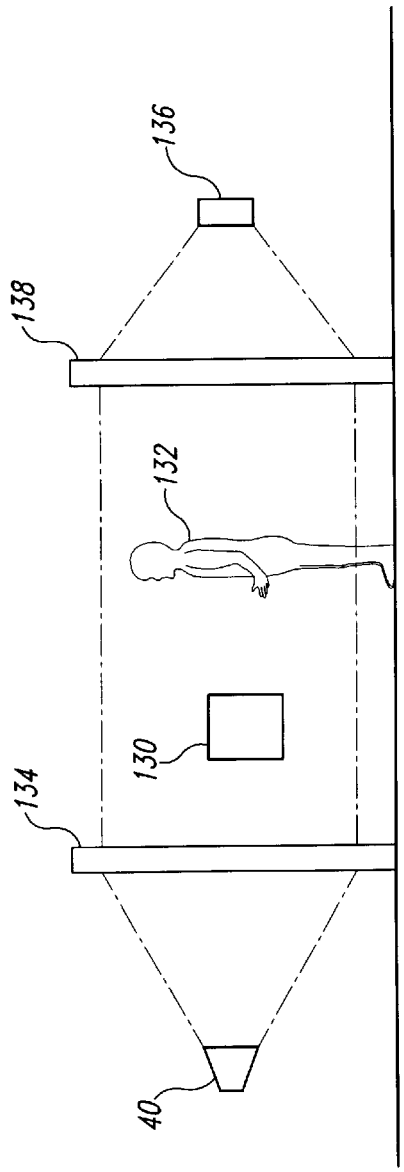
FIG. 12 is a diagrammatic representation of a millimeter wave system viewing objects behind an optically opaque barrier.

As shown in FIG. 12, the scanning imager 40 may be used to identify information about objects 130, 132 behind an optically opaque barrier 134, such as a concrete wall. Where the detector 46 is sufficiently sensitive, the detector 46 can detect millimeter wave energy from ambient sources, such as the sun. In some applications, however, it may be desirable to augment ambient energy with a separate millimeter wave source 136. The separate source 136 may be within the viewed environment or may be placed opposite another opaque barrier 138.

Figure 13:
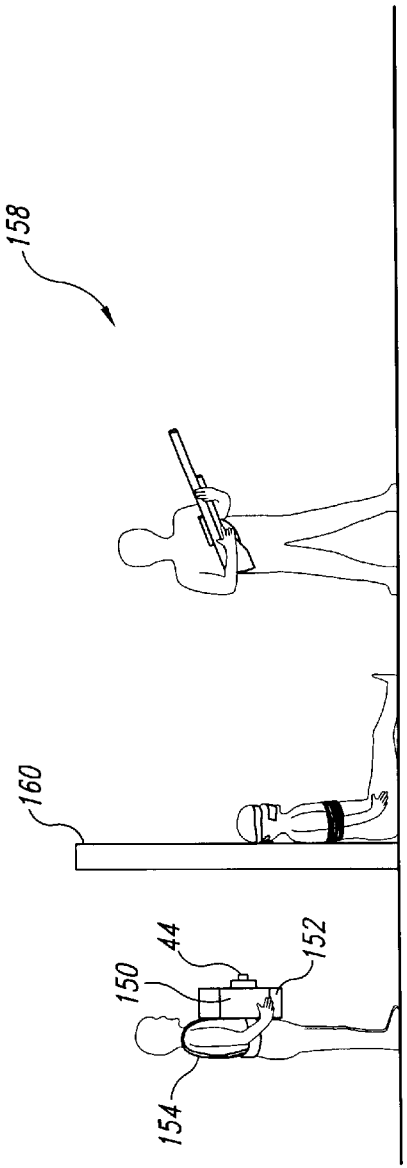
FIG. 13 is a diagrammatic representation of a human portable millimeter wave imaging system.

As shown in FIG. 13, the scanning imager 40 of FIG. 1 can be assembled with the MEMs scanner 44 of FIG. 3, a miniature super-cooler 150 and a battery 152 to produce a human portable system. Since the scanning imager 40 can operate with ambient millimeter wave energy or with a separate millimeter wave source, it is not necessary for an operator 154 to transport a millimeter wave source. The portable imager 40 is particularly useful for circumstances where human portability is advantageous. For example, as shown in FIG. 10, the imager 40 may be used by police or other operatives to view a hostage or other hostile environment 158 from behind a wall 160.

Although the invention has been described herein by way of exemplary embodiments, various other embodiments may be within the scope of the invention. For example, the scanning imager 46 may use non-raster scanning, such as vector scanning to image an area. Moreover, the range of the imager 46 may be optimized to allow viewing from substantial distances. Such embodiments would allow viewing through low vision environments, such as fog. This capability would be useful for such applications as docking boats or landing aircraft. Accordingly, the invention is not limited, except as by the appended claims.

What is claimed is:

1. An imaging apparatus, comprising:
   a millimeter wave detector having an input port and an electrical output, the detector being responsive to millimeter waves at the input port to produce an electrical signal indicative of the intensity of the millimeter waves;
   a scanner having a scanner input aligned to an external environment, the scanner including a plurality of central reflectors, each mounted to scan about a respective scan axis through a selected scan angle in response to a common drive signal, each of the scan axes being parallel, each central reflector including a material reflective to millimeter waves, the central reflectors being oriented to direct millimeter waves from an image field to the input port;
   a signal source coupled to the scanner and operative to provide the drive signal; and
   an electronic controller having an electronic input coupled to the electrical output, the controller being responsive to the electrical signal indicative of the intensity of the millimeter waves to generate image data representative of the image field.

2. The apparatus of claim 1 wherein each of the central reflectors is coupled for resonant motion about its respective scan axis.

3. The apparatus of claim 2 wherein each of the central reflectors has a resonant frequency substantially equal to the resonant frequency of other central reflectors.

4. The apparatus of claim 3 wherein the resonant frequency is higher than 10 Hz.

5. The apparatus of claim 1 further comprising a super-cooler thermally coupled to the detector.

6. The apparatus of claim 1 further comprising a millimeter wave lens positioned in a millimeter wave path between the external environment and one or more of the central reflectors.

7. The apparatus of claim 1 further comprising a millimeter wave lens positioned in a millimeter wave path between one or more of the central reflectors and the detector.

8. The apparatus of claim 1 wherein the electronic controller includes a memory array having a plurality of memory locations, each memory location corresponding to a respective location in the external environment, wherein the controller is operative to store the generated imaged data in the memory locations.

9. The apparatus of claim 1 further comprising a display coupled to the electronic controller and responsive to the image data to produce a visible display representative of the scanned external environment.

10. The apparatus of claim 2 further comprising a millimeter wave emitter having an output port aligned to the target object, the emitter being operative to produce millimeter waves at the output port.

11. The apparatus of claim 10 wherein the millimeter wave emitter is a broadband emitter.

12. A high frequency imaging device operative to image a target object through a barrier, where the barrier is transmissive to a selected high frequency, non-optical wavelengths, comprising:
    a scanning assembly having a scanning input that defines a field of view and a scanning output, the scanning assembly being configured to receive, from the field of view, energy at the selected wavelengths and to transmit the energy to the scanning output, the scanning assembly being operative to sweep the field of view through a predetermined scan pattern including a plurality of scan locations corresponding to expected locations of the target object, the scanning assembly including a frame and a plurality of discrete scanning segments, each scanning segment being coupled to the frame by a respective one or more supports, each support defining a respective scan axis, the scan axis being selected to define the scan pattern;
    a detector aligned to the scanning output responsive to the selected wavelengths to produce an electrical signal indicative of the amount of energy at the selected wavelengths; and
    an electronic controller coupled to the detector and operative to sample the electrical signal to produce image data corresponding to each of the scan locations.

13. The device of claim 12 further comprising a millimeter lens positioned in a millimeter wave path between the external environment and the scanning assembly.

14. The apparatus of claim 12 wherein each of the scanning segments and its respective one or more supports define a resonant system.

15. The apparatus of claim 14 wherein each of the resonant systems has a resonant frequency higher than 10 Hz.

16. The apparatus of claim 12 wherein the scanner, detector and controller are sized and weighted for carrying by a human.

17. The apparatus of claim 12 wherein the scanner includes a plurality of reflective plates, each reflective plate having a respective pivot axis.

* * * * *